(12) United States Patent
Stockhaus et al.

(10) Patent No.: US 6,561,854 B2
(45) Date of Patent: May 13, 2003

(54) CONNECTION SYSTEM

(75) Inventors: Andreas Stockhaus, Berlin (DE); Klaus Schulz, Berlin (DE); Frank Meyer-Gülden, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/815,653

(22) Filed: Mar. 23, 2001

(65) Prior Publication Data

US 2001/0051461 A1 Dec. 13, 2001

Related U.S. Application Data

(63) Continuation of application No. PCT/DE99/02922, filed on Sep. 9, 1999.

(30) Foreign Application Priority Data

Sep. 23, 1998 (DE) .......................................... 198 43 628

(51) Int. Cl.[7] .......................................... H01R 13/502
(52) U.S. Cl. ............................................ 439/701
(58) Field of Search ............................ 439/701, 347, 439/630, 342, 180, 260, 267, 681, 62, 64, 637; 361/728, 730, 775

(56) References Cited

U.S. PATENT DOCUMENTS

| | | | | |
|---|---|---|---|---|
| 4,821,149 A | | 4/1989 | Belanger, Jr. | |
| 5,016,142 A | * | 5/1991 | White | 361/415 |
| 5,154,631 A | * | 10/1992 | Belanger, Jr. | 439/377 |
| 5,393,234 A | * | 2/1995 | Yamada et al. | 439/62 |
| 6,095,862 A | * | 8/2000 | Doye et al. | 439/607 |
| 6,149,465 A | * | 11/2000 | Berg et al. | 439/630 |
| 6,325,649 B2 | * | 12/2001 | Stockhaus et al. | 439/180 |

FOREIGN PATENT DOCUMENTS

| | | |
|---|---|---|
| DE | 44 40 455 C2 | 5/1996 |
| DE | 296 07 793 U1 | 10/1997 |

* cited by examiner

*Primary Examiner*—P. Austin Bradley
*Assistant Examiner*—Phuongchi Nguyen
(74) *Attorney, Agent, or Firm*—Laurence A. Greenberg; Werner H. Stemer; Ralph E. Locher

(57) ABSTRACT

A connecting system for detachably mechanically connecting an electronic component to a support is described. The connecting system has fixed rails that are configured on the longitudinal sides of the support. When the connecting system is assembled, at least two grips on each longitudinal side of the electronic component grip under the fixing rails. Each fixing rail has at least one hole allowing the grips to be introduced vertically in relation to the support, in a direction Y, with the grips advancing in direction Z. The holes are configured in such a way that the advancing grips can pass through them during assembly without leaving the support.

3 Claims, 4 Drawing Sheets

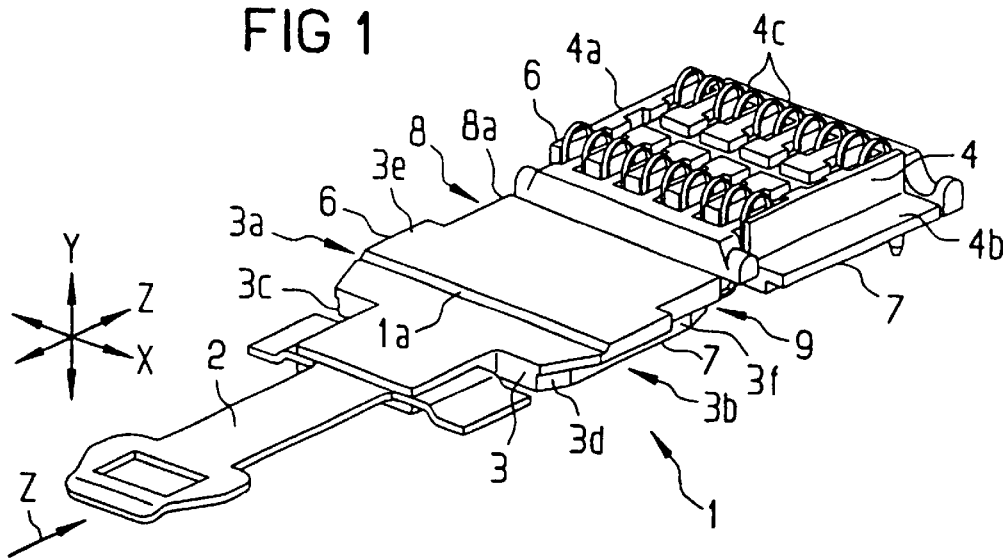
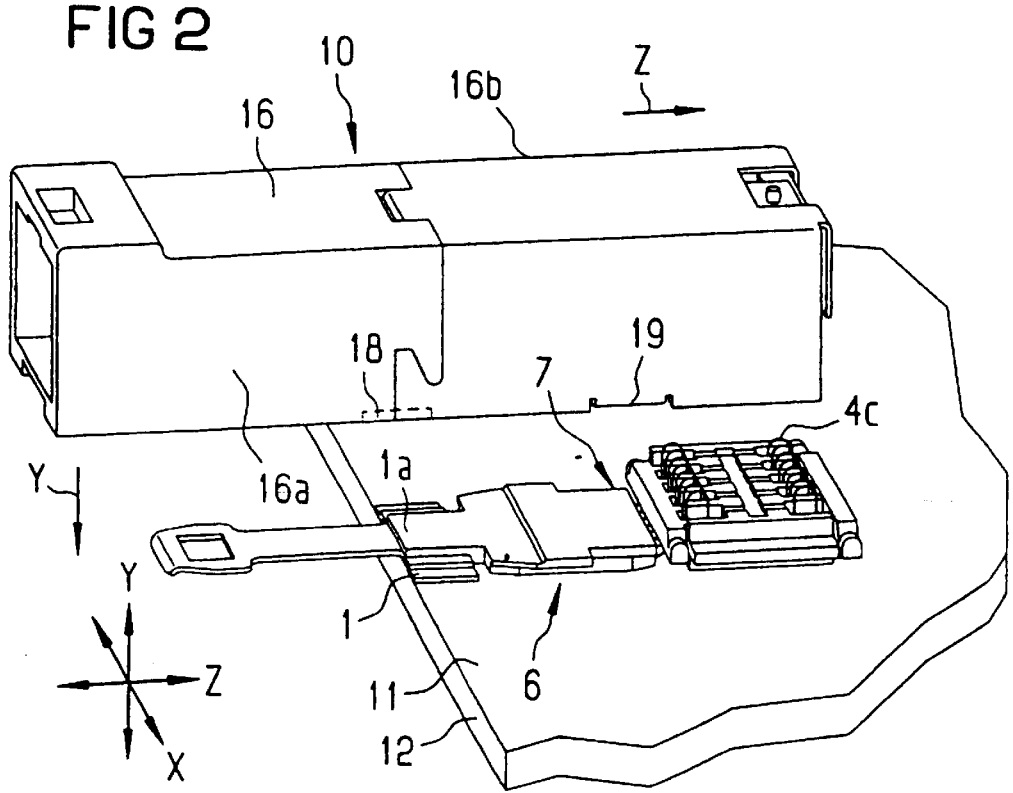

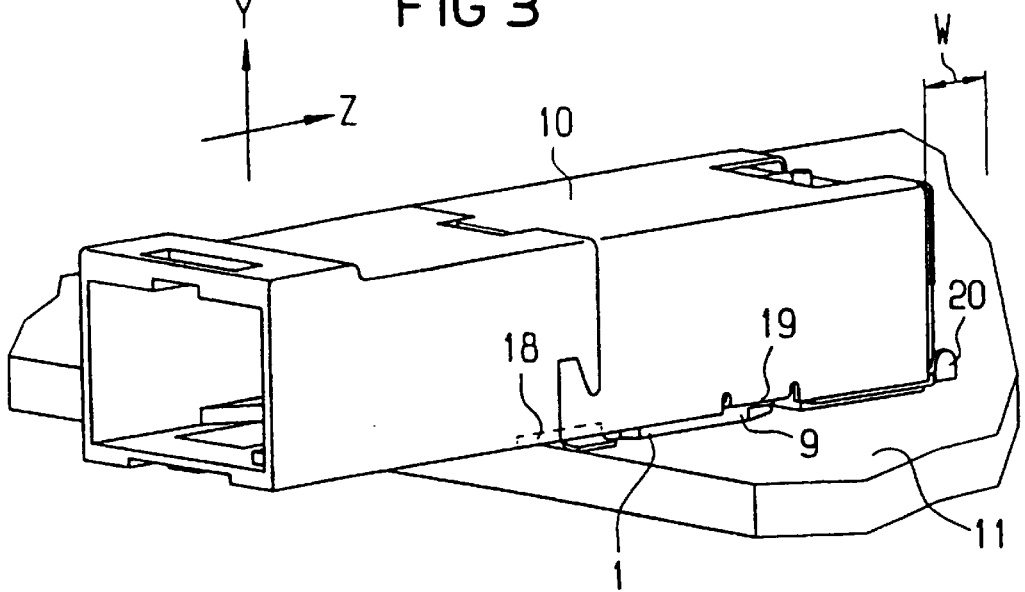
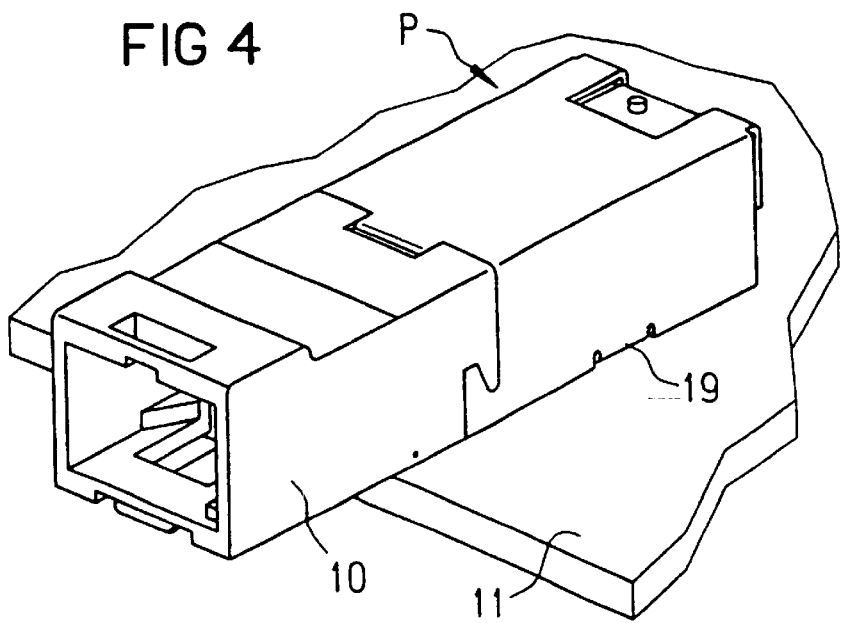

Y-DIRECTIONAL MOVEMENT FOR SNAPPING INTO PLACE | ONLY Z-DIRECTIONAL MOVEMENT

CONNECTION SYSTEM

CROSS-REFERENCE TO RELATED APPLICATION

This application is a continuation of copending International Application No. PCT/DE99/02922, filed Sep. 9, 1999, which designated the United States.

BACKGROUND OF THE INVENTION

FIELD OF THE INVENTION

The invention lies in the field of mounting electronic components or modules, in particular electrooptical modules (known as transceivers). When mounting modules of this type on carriers, for example printed-circuit boards provided with conductor tracks and connection contacts, there is the requirement on the part of the user for modules which can be placed on the printed-circuit board relatively freely and unrestrictedly. This requires modular configurations and suitable mechanical connections which—depending on the available mounting space and accessibility—allow simple horizontal insertion of the modules into suitable holders or permit vertical mounting of the modules.

U.S. Pat. No. 5,154,631 discloses a mounting device which has mounting rails, with a planar substrate as the carrier of an electric circuit having projections along two opposite edges. The projections may be formed vertically in the mounting rails, the substrate subsequently sliding along angled slots into an end position. Since, however, in the end position, the substrate is not secured against being pulled off in a vertical or angled direction, the mounting device is not suitable for the mounting of the electrooptical modules.

U.S. Pat. No. 5,734,558 discloses module variants each with a connection-contact strip which either protrudes at right angles from the underside of the module or penetrates the narrow rear wall of the rear region of the module, seen in the pushing-in direction. The first module variant consequently allows only mounting that is exclusively perpendicular to a holder, during which the resilient electrical contacts of the contact strip on the module side penetrate vertically into corresponding co-operating contacts of a contact receptacle on the holder side. This variant requires for mounting and removal a corresponding free space in the vertical direction (referred to hereafter as the Y direction) above the holder. The other variant allows only mounting in a horizontal direction parallel to the upper side of the holder (hereafter referred to as the Z direction), that requires a corresponding free space in front of the holder. Moreover, precise guiding of the module during the connection to the holder is not provided in either variant of the module.

SUMMARY OF THE INVENTION

It is accordingly an object of the invention to provide a connection system that overcomes the above-mentioned disadvantages of the prior art devices of this general type, which allows both mounting exclusively in the Z direction and mounting with a movement in the Y direction and subsequent movement in the Z direction, with an extremely small free space being required.

With the foregoing and other objects in view there is provided, in accordance with the invention, a connection system containing a holder having longitudinal sides, an upper side, and holding rails disposed on the longitudinal sides. An electronic component is releasably mechanically connected to the holder and covers at least an amount of residual travel before arriving in an end position. The electronic component has longitudinal sides with two holding regions disposed on each of the longitudinal sides that interact at least partially with the holding rails during the residual travel. The holding rails having gaps formed therein for allowing a vertical insertion of the holding regions perpendicularly in relation to the upper side of the holder. The residual travel into the end position takes place exclusively along a pushing-in direction running parallel to the upper side of the holder. The holding regions are rear-engagement devices which, as seen in the pushing-in direction, are disposed one behind another and, during the residual travel, grip at least partially under the holding rails. The gaps are formed such that the rear-engagement devices that are leading in the pushing-in direction pass the gaps during a mounting operation without being able to come away from the holder transversely in relation to the pushing-in direction.

One significant advantage of the connection system according to the invention is that, depending on the circumstances specific to the particular application, in particular according to the space available in each case for mounting and removal, and the desired configuration of the holder on a carrier, it allows if need be both mounting or removal exclusively in the Z direction and mounting essentially vertically, with a movement in the Y direction with a subsequent (small residual) movement in the Z direction, covering the residual amount of travel. One significant aspect of this is that both mounting variants are inherent to the connection system, so that it is quite possible for different sequences of movements also to be realized during mounting and removal. One significant advantage of the invention for user friendliness and reliability is that, when mounting in the Z direction, it is ensured by the envisaged configuration of the gaps with respect to the leading rear-engagement devices that, even when they are moving past the gaps, the rear-engagement devices cannot leave the holding rails transversely in relation to the pushing-in direction—at least not without considerable force being exerted. The connection system according to the invention consequently ensures a guided and reliable mounting movement in the Z direction (pushing-in direction) in spite of the alternative mounting and removal possibilities.

In principle, the reliable guidance of the leading rear-engagement devices during mounting in the Z direction (exclusively) could be ensured by the width of the rear-engagement devices being greater than the gaps and, for example, by the rear-engagement devices being able to be temporarily reduced in their width elastically for the mounting in the vertical direction. However, a configuration that is preferred from a technical mounting viewpoint provides that the width of the gaps corresponds at least to the width of the rear-engagement devices that are leading in the pushing-in direction.

To allow the leading rear-engagement devices to pass the gaps reliably during the mounting operation in the Z direction (exclusively), according to a preferred configuration of the invention it is provided that the gaps of holding rails lying opposite one another are at a greater spacing than the clear spacing of the assigned leading rear-engagement devices lying opposite one another.

In particular in cases where there are a relatively large number of interactions during mounting, it is advantageous if the gaps have lead-in slopes and/or removal slopes, along which the rear-engagement devices slide during mounting or removal of the component vertically in relation to the holder. It is particularly preferred that the rear-engagement devices can in this case be of a resilient configuration.

Other features which are considered as characteristic for the invention are set forth in the appended claims.

Although the invention is illustrated and described herein as embodied in a connection system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, perspective view of a holder according to the invention;

FIGS. 2 to 4 are perspective views of a mounting sequence of a connection system between a component and the holder according to FIG. 1;

DESCRIPTION OF THE PREFERRED EMBODIMENTS

Figure 5:
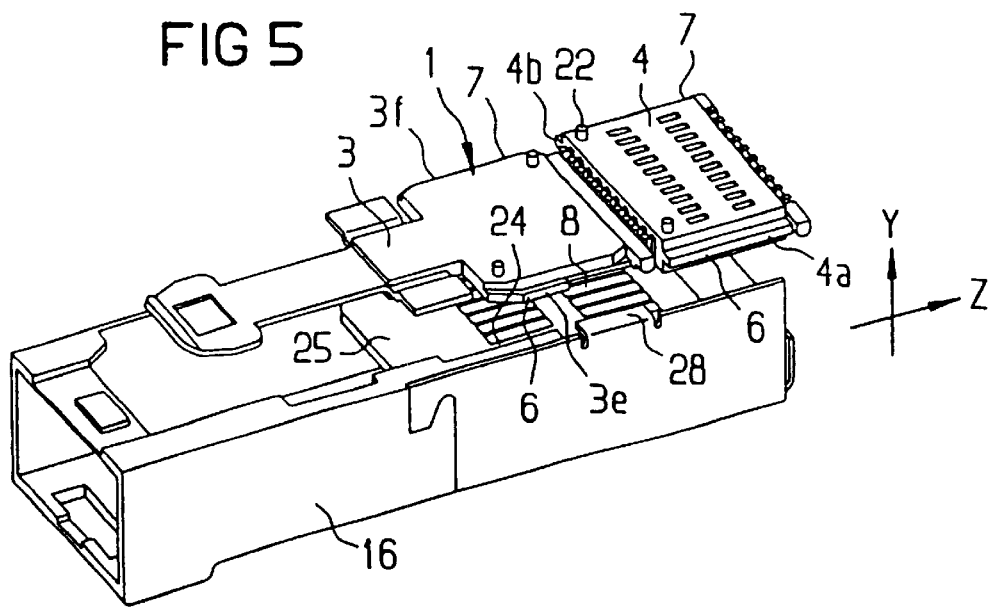
FIGS. 5 to 7 are perspective views of the mounting sequence from an underside of the component.

In all the figures of the drawing, sub-features and integral parts that correspond to one another bear the same reference symbol in each case. Referring now to the figures of the drawing in detail and first, particularly, to FIG. 1 thereof, there is shown a holder 1. The holder 1 is formed of essentially three components, and as seen in a direction of a longitudinal axis of the holder 1, contains a locking tongue 2, a holding block 3 and a connection part 4. The longitudinal axis of the holder 1 coincides with a pushing-in direction Z, defined according to FIG. 1 as the Z direction and running horizontally and parallel to an upper side 1a of the holder 1. The holding block 3 has at its front end leading slopes or bevels 3c, 3d on longitudinal sides 3a, 3b for guiding a component housing, still to be described in more detail, or a rear-engagement device on the component side. The bevels 3c, 3d are adjoined by portions 3e, 3f of parallel holding rails 6, 7 running on both sides that are formed on the longitudinal sides 3a, 3b. The holding rails 6, 7 are interrupted in a rear region of the holding block 3 by clearances or gaps 8, 9. The gaps 8, 9 reach as far as the connection part 4, and on the narrow sides of the connection part portions 4a, 4b continue forming the rails 6, 7.

A mounting sequence of a component 10 on the holder 1 of the type shown in FIG. 1 is now explained with reference to FIGS. 2 to 4. The holder 1 is in this case mounted on an upper side 11 of a printed-circuit board 12, represented in an indicated way, and its contacts are made with non-illustrated electrical supply leads. In the case of the mounting variant explained below, the mounting includes a vertical downward movement perpendicularly in relation to the upper side 1a of the holder 1 (Y direction) and a subsequent, comparatively small pushing-in movement in the Z direction or pushing-in direction Z.

The component 10 has a component housing 16, which has on each of its longitudinal sides, seen in the pushing-in direction Z, two rear-engagement devices 18, 19, disposed one behind the other. In the view according to FIG. 2, only the rear-engagement devices 18, 19, which are formed on a side 16a of the component housing facing the viewer, are visible. Lying opposite on the other longitudinal side 16b of the housing 16, corresponding, similar rear-engagement devices, facing the rear-engagement devices 18, 19, are formed. Revealed in FIG. 2 are resilient connection contacts 4c (see also FIG. 1) of the connection part 4, which, in a final mounted state, are in contact with corresponding connection contact surfaces on the underside of a printed-circuit board disposed in the housing 16. The contacts 4c consequently exert a vertical spring force in the Y direction, which is absorbed in the interaction still to be explained in more detail between the rear-engagement devices 18, 19 and the holding rails 6, 7 of the holder 1.

FIG. 3 shows the component 10 and the holder 1 in an advanced stage of mounting, in which the mounting movement in the Y direction has already been completed, but the remaining mounting in the Z direction still has to take place. With the remaining residual mounting movement, a residual amount of travel W is covered into an end position (FIG. 4). The rear-engagement devices 18, 19 have in this case already been lowered to the level of a lower side of the rails 6, 7 facing the upper side 11 of the carrier. The rear engagement device 19 has in this case penetrated the gap 9. During the subsequent (residual) mounting movement in the Z direction, the component 10 is displaced to the rear until its reaches an end position P shown in FIG. 4. In this case, a rear actuating cam 20, which can be seen in FIG. 3, is moved by a slideway guide (not represented in any more detail) in such a way that the contacts 4c (FIG. 2) are initially removed from the plane of movement of the printed-circuit board on the component side and, when the end position P is reached (FIG. 4), spring back onto the assigned connection contact surfaces. The opposing force in relation to the spring forces exerted as this happens is applied, as already mentioned at the beginning, by the engagement of the rear-engagement device behind the assigned rails.

Figure 6:
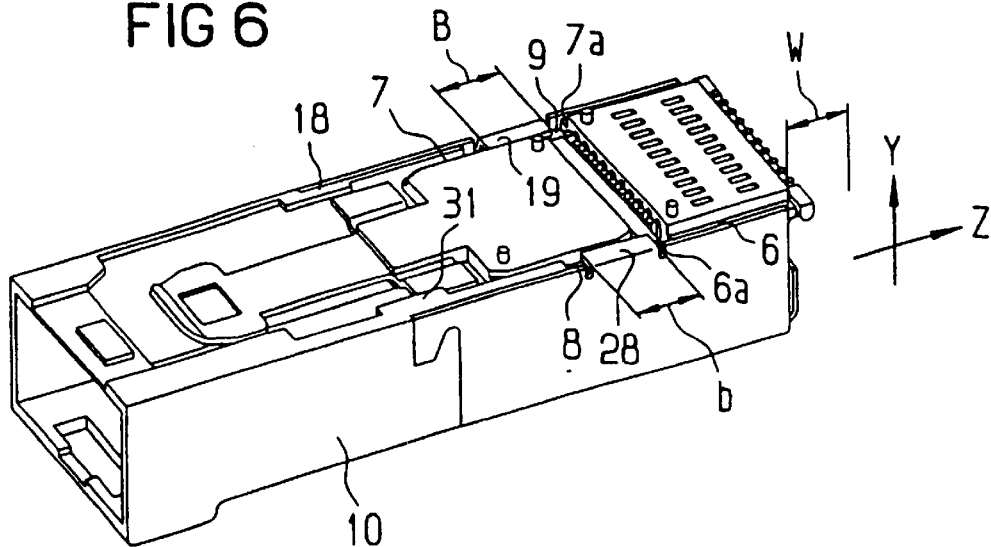
Figure 7:
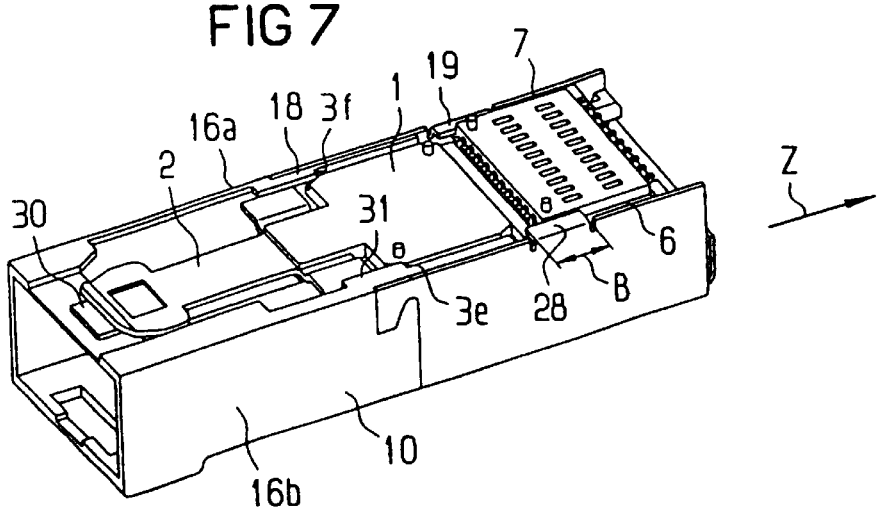

For further explanation of the mounting operation described above, details of the connection system are represented in FIGS. 5, 6 and 7 in a perspective view from the underside of the configuration (with the printed circuit board 12 from FIG. 2 omitted). The underside of the holder 1 has, in the region of the holding block 3 and the connection part 4, centering pins 22 for positioning the holder on the surface 11 (FIG. 2) of the printed circuit board 12. Furthermore, the portions 3e, 3f and 4a, 4b of the rails 6, 7 can be seen. Also represented are connection contact surfaces 24 of a printed-circuit board 25 contained in the housing 16, which in the final mounted state co-operate with the contacts 4c. The representation in FIG. 5 shows the gap 8 which is provided in the holding rails 6 and, in the course of further mounting, is penetrated by a rear-engagement device 28 lying opposite the rear-engagement device 19 (shown in FIG. 2).

FIG. 6 shows the component 10 after completion of the mounting movement in the Y direction and before the component 10 is moved into its end position by the amount of residual travel W in the Z direction. In this state, the rear-engagement devices 19, 28 that are at the rear, seen in the pushing-in direction Z (referred to hereafter with respect to the pushing-in direction Z also as leading rear-engagement devices) have already penetrated the gap 8, 9 respectively assigned to them and are bearing against the undersides 6a, 7a of the holding rails 6, 7. A width b of the gaps 8, 9 is dimensioned such that it is wider than the width B of the rear-engagement devices 19, 28.

FIG. 7 shows the component 10 and the holder 1 shortly before reaching the end mounting position, in which a corresponding locking lug 30 penetrates a front clearance in the locking tongue 2, in order to lock the component 10 with respect to the holder 1 in the Z direction. The rear-engagement devices 19, 28 that are leading in the Z direction are in this case already resting over a considerable portion of a width B on the undersides 6a, 7a of the rails 6, 7 and consequently engage behind the rails 6, 7. The rear-engagement devices 18, 31 formed further forward on the longitudinal side 16a, 16b, seen in the pushing-in direction Z, have run onto the undersides of the portions 3e, 3f of the holder 1 in a corresponding way.

Figure 8A:
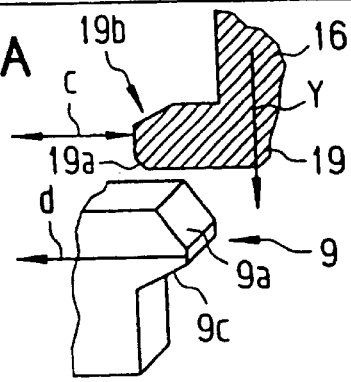
FIGS. 8a and 8b are partial, perspective views of the situation during mounting in Y-Z directions.
Figure 8B:
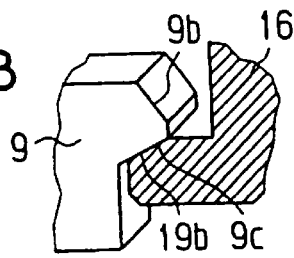

The situation when the component 10 is placed onto the holder 1 is schematically represented in detail with regard to the rear-engagement devices in FIGS. 8a and 8b. When the component 10 or its housing 16 is lowered in the Y direction, a run-on slope 19a of one of the rear-engagement devices represented by way of example (e.g. 19) comes into physical contact with a lead-in slope 9a of the gap 9 (see also FIG. 1). As a result, the rear-engagement devices 19, 28 lying opposite one another (FIG. 6) are extended in their spacing c to a spacing d, which exists between the vertical surfaces of the lug-like projections lying opposite one another (only the projection 9b is shown here) of the gaps 8, 9. In this case, the rear-engagement devices 19, 28 facing one another spring open elastically and snap in behind the lug-like projection 9b in the region of the gap 9. In this case, a further slope 19b then bears against an assigned slope 9c of the projection 9b. In this way, the component can also be removed again vertically from this position—although only with a certain vertical exertion of force in the Y direction.

Figure 9:
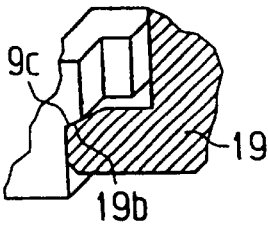
FIG. 9 is a partial, perspective view of a detail of the connection system for explaining the situation during mounting only in the Z direction.

An alternative type of mounting is explained below with renewed reference to FIGS. 1 and 6 and also 9. It is alternative because the component can also be mounted and removed exclusively in the Z direction. During the pure Z movement, the leading rear-engagement device 19, 28 are already guided in the frontal region of the holding block 3, by the bevels 3c, 3d, into the desired plane of movement below the portions 3a, 3b of the holding rails 6, 7. The leading rear-engagement device 19, 28 in this case pass the gaps 8, 9 without being able to leave the holder again from these gaps in the vertical direction (at least under the effect of normal mounting forces). As FIG. 9 indicates in this respect, this is because the rear-engagement devices (only one rear-engagement device 19 is shown by way of example) continue, with the slope 19b, to be in physical contact with the slope 9c in the region of the gap 9. This ensures that, even in the case of mounting exclusively in the Z direction, the component is always guided reliably and highly precisely onto the holder until it is in the end position. A corresponding situation exists if the component is removed exclusively in the Z direction.

We claim:

1. A connection system, comprising:
    a holder having longitudinal sides, an upper side, and holding rails disposed on said longitudinal sides; and
    an electronic component releasably mechanically connected to said holder and covering at least an amount of residual travel before arriving in an end position, said electronic component having longitudinal sides with two holding regions disposed on each of said longitudinal sides and interacting at least partially said holding rails during the residual travel;
    each of said holding rails having two gaps formed therein for allowing a vertical insertion of said holding regions perpendicularly in relation to said upper side of said holder, the residual travel into the end position taking place exclusively along a pushing-in direction running parallel to said upper side of said holder, said gaps formed in said holding rails lying opposite one another being space apart by a first distance along the pushing-in direction from each other;
    said holding regions being rear-engagement devices being disposed, as seen in the pushing-in direction, one behind another and, during the residual travel, gripping at least partially under said holding rails;
    said gaps being formed to cause said rear-engagement devices leading in the pushing-in direction to pass said gaps during a mounting operation without being able to come away from said holder transversely in relation to the pushing-in direction; and
    said corresponding rear-engagement devices lying opposite one another being spaced apart by a second distance along the pushing-in direction from each other and the second distance being less than the first distance.

2. The connection system according to claim 1, wherein said gaps have at least one of lead-in slopes and removal slopes, along which said rear-engagement devices slide during mounting and removal of said electronic component vertically in relation to said holder.

3. The connection system according to claim 1, wherein said rear-engagement devices are resilient.

* * * * *